(12) United States Patent
Oudshoorn et al.

(10) Patent No.: US 6,979,933 B2
(45) Date of Patent: Dec. 27, 2005

(54) APPARATUS AND METHOD FOR CHARGING AND DISCHARGING A CAPACITOR

(75) Inventors: Mark Oudshoorn, Parrish, FL (US); Donald Vanderslius, Sarasota, FL (US)

(73) Assignee: Viking Technologies, L.C., Sarasota, FL (US)

( * ) Notice: Subject to any disclaimer, the term of this patent is extended or adjusted under 35 U.S.C. 154(b) by 0 days.

(21) Appl. No.: 10/621,797

(22) Filed: Jul. 17, 2003

(65) Prior Publication Data

US 2004/0090798 A1 May 13, 2004

Related U.S. Application Data

(60) Provisional application No. 60/408,277, filed on Sep. 5, 2002, and provisional application No. 60/408,468, filed on Sep. 5, 2002.

(51) Int. Cl.[7] .......................... H03H 9/125; H03H 9/13; H02N 2/00
(52) U.S. Cl. ............. 310/316.03; 310/306; 310/316.01; 318/116; 318/117; 320/166
(58) Field of Search ...................... 310/316.03, 316.01, 310/31, 306, 311; 318/116, 117

(56) References Cited

U.S. PATENT DOCUMENTS

| | | | | |
|---|---|---|---|---|
| 4,255,782 A | * | 3/1981 | Joyce | 363/8 |
| 4,520,289 A | | 5/1985 | Sato et al. | 310/316.03 |
| 4,625,137 A | * | 11/1986 | Tomono | 310/317 |
| 4,667,279 A | * | 5/1987 | Maier | 363/46 |
| 4,736,131 A | | 4/1988 | Fujimoto | 310/328 |
| 4,749,897 A | | 6/1988 | Natsume et al. | 310/317 |
| 4,808,874 A | | 2/1989 | Stahlhuth | 310/328 |
| 4,866,326 A | | 9/1989 | Nikawa et al. | 310/315 |
| 4,947,074 A | | 8/1990 | Suzuki | 310/316.03 |

(Continued)

FOREIGN PATENT DOCUMENTS

| | | | | |
|---|---|---|---|---|
| EP | 0325764 | | 8/1989 | ........... H01L/41/08 |
| EP | 0 641 066 A1 | | 3/1995 | ........... H02M/3/337 |
| EP | 1 067 608 A1 | | 10/2001 | ........... H01L/41/04 |
| EP | 1 139 448 A1 | | 10/2001 | ........... H01L/41/04 |
| EP | 1 182 341 A1 | | 2/2002 | ........... H01L/41/08 |
| JP | 6129681 | | 12/1986 | ........... H01L/41/08 |
| JP | 01185175 | | 7/1989 | ............ H02N/2/00 |
| JP | 07213061 | | 11/1995 | ............ H02M/3/28 |
| US | WO 0178160 | | 10/2001 | ........... H01L/41/08 |
| WO | WO 01/22502 A1 | | 9/2000 | ........... H01L/41/04 |
| WO | WO 01/04481 A1 | | 1/2001 | ........... F02D/41/20 |
| WO | WO 01/33061 A1 | | 5/2001 | ........... F02D/41/20 |

OTHER PUBLICATIONS

The International Search Report dated Oct. 30, 2003.
How to Use Inductor Type EMI Suppression Filters, 'Online, p. 23 XP002266191, <URL: http://www.murata-.com/emc/knowhow/pdfs/tel5ey/23e.pdf>, 'retrieved on Dec. 31, 2003.
Bielawskia John et al: "Low Profile LTCC Transformers", 2002 International Symposium on Microelectronics; Denver, Co, U.S., Sep. 4–6, 2002, 'Online, vol. 4931, 2002, pp. 76–80, XP002266192 Proc SPIE Int. Soc Opt Eng; Proceedings SPIE—The International Society for Optical Engineering 2002, Retrieved from the Internet: <URL:http://www.electroscience.com/publications/IMAPS2002(1).pdf>retrieved on Dec. 26, 2003, the whole document.

*Primary Examiner*—Tom Dougherty
*Assistant Examiner*—J. Aguirrechea
(74) *Attorney, Agent, or Firm*—Young & Basile, P.C.

(57) ABSTRACT

An apparatus for electrically stimulating a smart material includes a controllable power source for charging the smart material and/or switching circuitry for discharging the smart material. The controllable power source includes a regulated DC to DC converter having controllable drive circuitry associated therewith. The drive circuitry can be self-oscillating through associated feedback means. The switching circuitry can be responsive to one or more control signals.

37 Claims, 4 Drawing Sheets

U.S. PATENT DOCUMENTS

| | | | |
|---|---|---|---|
| 4,973,876 A | 11/1990 | Roberts | 310/316.01 |
| 4,974,074 A | 11/1990 | Tenma | 358/92 |
| 5,036,263 A | 7/1991 | Yamada et al. | 310/116 |
| 5,053,668 A | 10/1991 | Mitsuyasu | 310/317 |
| 5,130,598 A | 7/1992 | Verheyen et al. | 310/316 |
| 5,138,217 A | 8/1992 | Wada et al. | 310/316 |
| 5,316,013 A | 5/1994 | Striebel et al. | 128/754 |
| 5,333,455 A | 8/1994 | Yoshioka | 60/533 |
| 5,388,751 A | 2/1995 | Harada et al. | 228/4.5 |
| 5,465,021 A | 11/1995 | Visscher et al. | 310/328 |
| 5,479,062 A * | 12/1995 | Yoshino | 310/316.03 |
| 5,543,679 A | 8/1996 | Morino et al. | 310/316.03 |
| 5,604,673 A | 2/1997 | Washburn et al. | 363/147 |
| 5,895,998 A | 4/1999 | Saylor | 310/316 |
| 5,962,951 A | 10/1999 | Bishop | 310/316.03 |
| 6,109,245 A | 8/2000 | Egger et al. | 123/490 |
| 6,133,714 A * | 10/2000 | Hoffmann et al. | 320/166 |
| 6,137,208 A * | 10/2000 | Hoffmann et al. | 310/316.03 |
| 6,147,433 A * | 11/2000 | Reineke et al. | 310/316.03 |
| 6,236,190 B1 | 5/2001 | Hoffmann et al. | 320/166 |
| 6,459,244 B1 * | 10/2002 | Hoffmann et al. | 320/166 |
| 2001/0030306 A1 | 10/2001 | Moler et al. | 251/129.06 |
| 2002/0121958 A1 | 9/2002 | Schrod | 336/200 |

\* cited by examiner

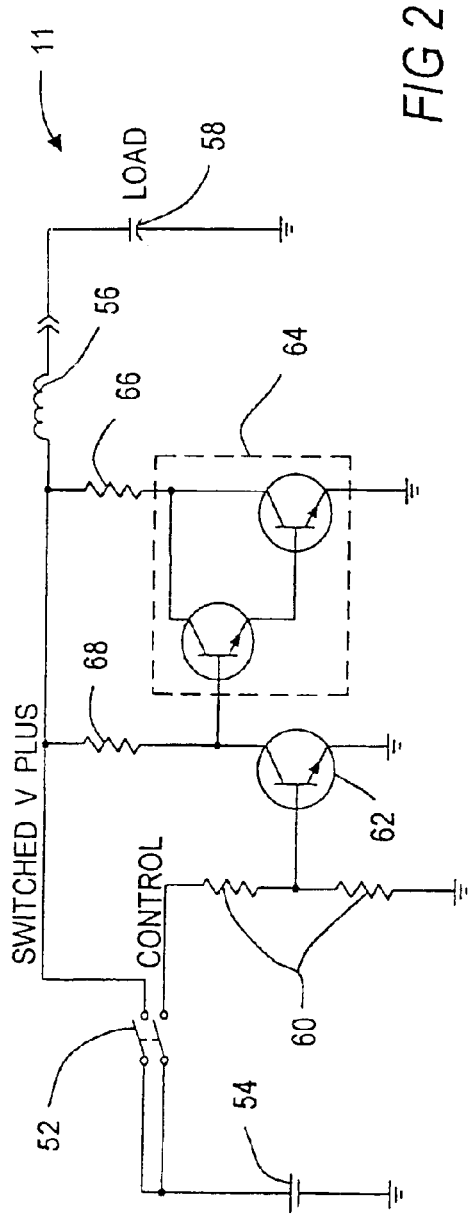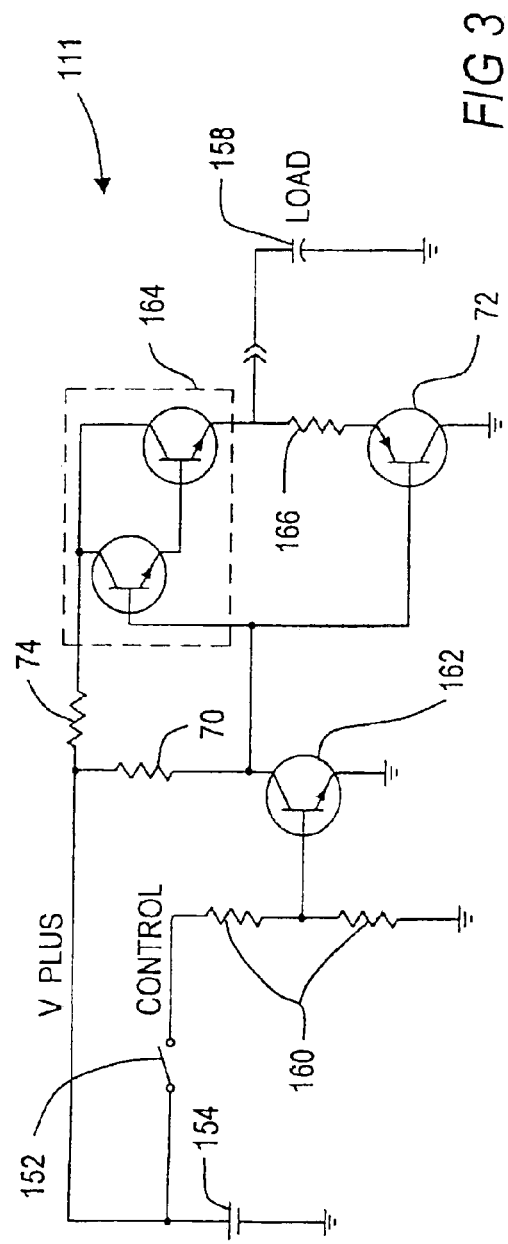

APPARATUS AND METHOD FOR CHARGING AND DISCHARGING A CAPACITOR

CROSS REFERENCE TO RELATED APPLICATIONS

This application is a continuation of provisional patent application Ser. Nos. 60/408,277 and 60/408,468, both filed on Sep. 5, 2002, which is incorporated by reference herein. This application is related to U.S. patent application Ser. No. 10/630,065 filed Jul. 30, 2003 for an Apparatus and Method for Charging and Discharging a Capacitor to a Predetermined Setpoint.

FIELD OF THE INVENTION

The present invention relates to electronic methods and circuits for controlling general-purpose, smart material-based actuators.

BACKGROUND OF THE INVENTION

Actuator technologies are being developed for a wide range of applications. One example includes a mechanically-leveraged smart material actuator that changes shape in response to electrical stimulus. Since this shape change is generally effectuated predominantly along a single axis, such actuators can be used to perform work on associated mechanical systems including a lever in combination with some main support structure. Changes in axial displacement are magnified by the lever to create an actuator with a useful amount of displacement and force. This displacement and force is useful for general-purpose industrial valves, beverage dispensers, compressors or pumps, brakes, door locks, electric relays, circuit breakers, and most applications employing a solenoid-type actuator. Smart materials, however, piezoelectric specifically, can require hundreds of volts to actuate and cause displacement. This type of voltage may not be readily available and may have to be derived from a lower voltage as one would find with a battery.

Another characteristic of piezoelectric materials is that the materials are capacitive in nature. Moreover, a single actuator is often controlled using two separate signals: a main supply and a ground using watts of energy during the moment of actuation.

SUMMARY OF THE INVENTION

The present invention provides a simple, low-power, and cost-effective means to drive mechanically-leveraged smart material actuator including a specialized power source operatively connected to switching circuitry.

The specialized power source of the present invention includes a controllable power source, a regulated direct current (DC to DC) converter, to apply a known voltage potential across a smart material and thereby convert a control voltage to a level suitable for the smart material. Thus, according to the present invention, the control and main supply signals are combined into one conductor. This permits the proposed invention to be retrofit into present control systems, directly replacing existing actuators.

The present invention further includes a smart material actuator coupled to one or both of a controllable power source for charging the smart material actuator and switching circuitry for discharging the smart material actuator. According to a first embodiment of the invention, the controllable power source is a regulated DC to DC converter that includes a transformer having primary and secondary windings. The primary winding of the transformer, in turn, is coupled to controllable drive circuitry for generating drive signals 180° out of phase with one another. To this end, the controllable power source operates in a binary manner: either supplying a known stimulating voltage potential across the smart material, or shorting across the smart material. According to an embodiment of the present invention, the drive circuitry of the controllable power source can further include feedback means such that the circuitry is self-oscillating. The feedback means can further include push-pull circuitry as well as an auxiliary winding associated with the transformer. The push-pull circuitry can further include a pair of negative-positive-negative (NPN) transistors.

A rectifier may further be associated with the secondary winding of the transformer for generating a DC voltage from an alternating current (AC) signal associated with the secondary winding. Noise reduction circuitry can also be coupled to the secondary winding of the transformer for filtering noise that may be generated by the controllable drive circuitry.

An apparatus for driving a smart material actuator according to the present invention thus includes a controllable power source for charging the smart material actuator and switching circuitry coupled between the controllable power source and the smart material actuator such that the switching circuitry discharges the smart material actuator upon removal of a power source. The rate of the discharge of the smart material actuator is determined by the impedance of the switching circuitry whereas the rate of charge of the controllable power source is determined by the impedance of the controllable power source.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 2 is an electronic schematic of a first embodiment of switching circuitry according to the present invention;

FIG. 3 is an electronic schematic of a second embodiment of switching circuitry according to the present invention;

DESCRIPTION OF THE PREFERRED EMBODIMENT

Figure 1:
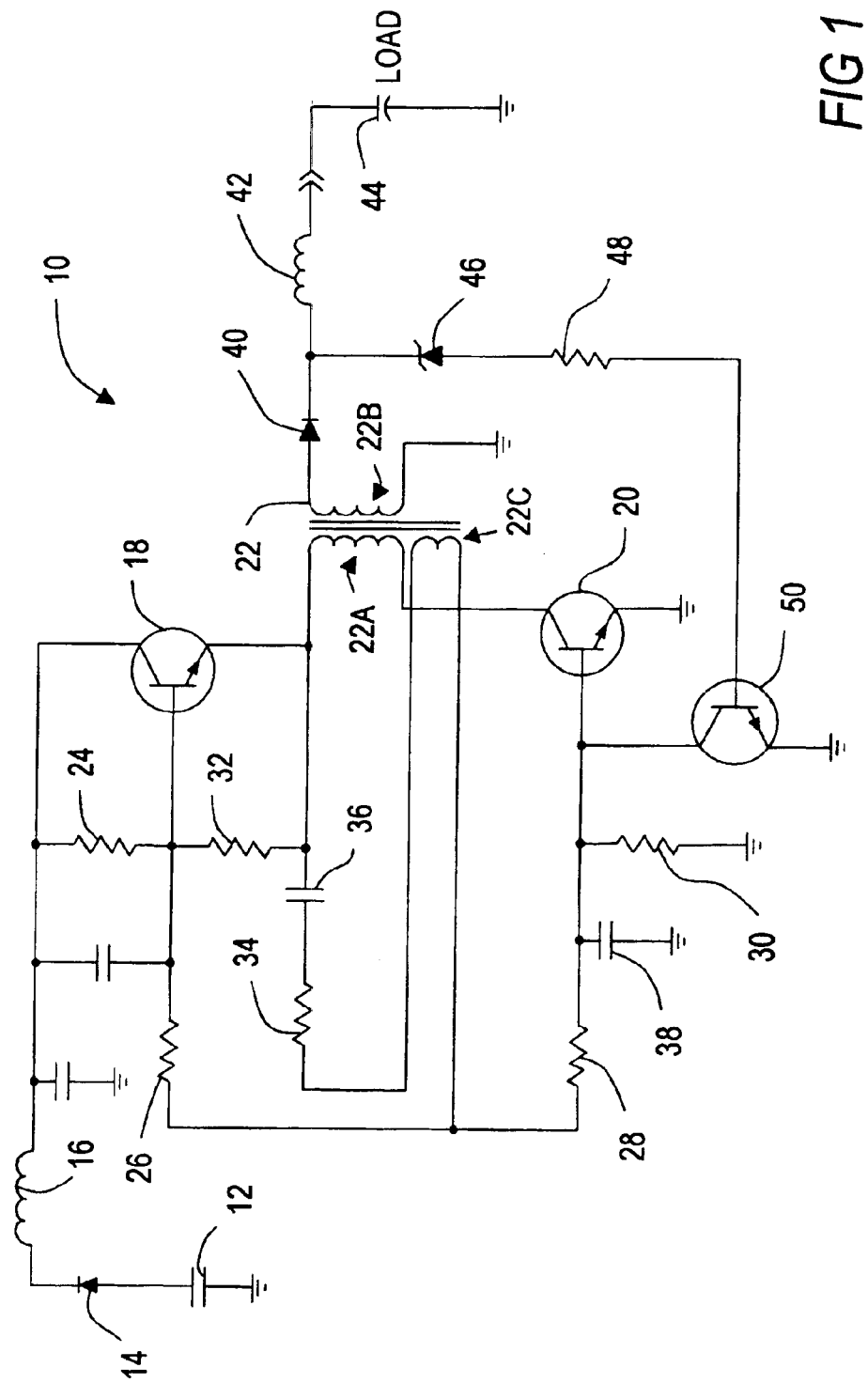
FIG. 1 is an electronic schematic of a controllable power source according to the present invention.

FIG. 1 is an electronic schematic diagram illustrating a controllable power source 10, where a voltage source, or input voltage, 12 of known potential is connected to a reverse protection diode 14 coupled in series with a bead inductor 16. The bead inductor 16 acts as a filter to remove noise generated by the collector of an NPN transistor 18 such that it does not reach the voltage source 12. The NPN transistor 18 and an NPN transistor 20 from a push-pull driver for a transformer 22. Resistors 24, 26, 28, 30 form resistive voltage dividers and set the basic bias points for the NPN transistors 18, 20. The transformer 22 is wound not only with primary and secondary windings 22A and 22B but also an auxiliary winding 22C. The auxiliary winding 22C on the transformer 22, resistors 32, 34, 28, and capacitors 36, 38 form feedback means for creating oscillation on the bases of the NPN transistors 18, 20. The oscillation is 180 degrees out of phase between the two NPN transistors 18, 20, thus forming a self-oscillating push-pull transformer driver. The secondary winding 22B of transformer 22 is connected to a rectifier in the form of a diode 40, which is connected to a bead inductor 42 and a capacitive load 44, in this case a piezoelectric smart material actuator. The bead inductor 42 acts as a filter to remove noise generated by the oscillation of the circuit and feeds the capacitive load 44. A Zener diode 46 acts as feedback means through a current limiting resistor 48. When the Zener voltage is exceeded a transistor 50 is turned on, causing the base of the transistor 20 to be grounded and stopping the self-oscillating mechanism.

Referring now to FIG. 2, switching circuitry 11 for discharging a smart material actuator capacitive load 58 is shown. When a switch 52 is closed, current flows from a voltage source 54 through the switch 52 and through the bead inductor 56 for charging the capacitive load 58 representing, in this case, a piezoelectric smart material actuator. Also, current flows into a resistive voltage divider network 60 driving an NPN transistor 62 on, which turns an NPN Darlington pair 64 off. The rate of charge is determined by the impedance of the bead inductor 56, the resistor 66 and the capacitive load 58. When the switch 52 is opened, the current stops flowing in the capacitive load 58 and the NPN transistor 62 is turned off. This turns the NPN Darlington pair 64 on, causing current to flow through the resistor 66 for discharging the capacitive load 58. The rate of discharge is determined by the resistor 66 and the capacitive load 58. The resistor 68 and the base of NPN transistor 62 serve as a level translator between the switched voltage source 54 and a control signal. Therefore, the resistor 68 and the base of NPN transistor 62 do not have the same voltage levels or voltage swings.

Referring now to FIG. 3, a second embodiment of switching circuitry 111 for discharging a smart material actuator capacitive load 158 is shown. When the switch 152 is closed, current flows into the voltage divider network 160 from the source 154, turning the NPN transistor 162 on and causing current to flow through the resistor 70. This turns the NPN Darlington transistor pair 164 off, and the positive-negative-positive (PNP) transistor 72 on, causing current to flow through the resistor 166 for discharging the capacitive load 158. The rate of discharge is determined by the impedance of the resistor 166 and the capacitive load 158. When the switch 152 is open, the NPN transistor 162 turns off, allowing current to flow through the resistor 70 to the base of the PNP transistor 72, turning the PNP transistor 72 off. The NPN Darlington pair 164 supplies current to the capacitive load 158 through the resistor 74. The rate of charge is determined by the impedance of the resistor 74 and the capacitive load 158. The resistor 70 and the NPN transistor 162 serve as a level translator between the voltage source 154 and a control signal generated by the closure of switch 152, for example. Therefore, the resistor 70 and the base of NPN transistor 162 do not have to have the same voltage levels or voltage swings.

Figure 4:
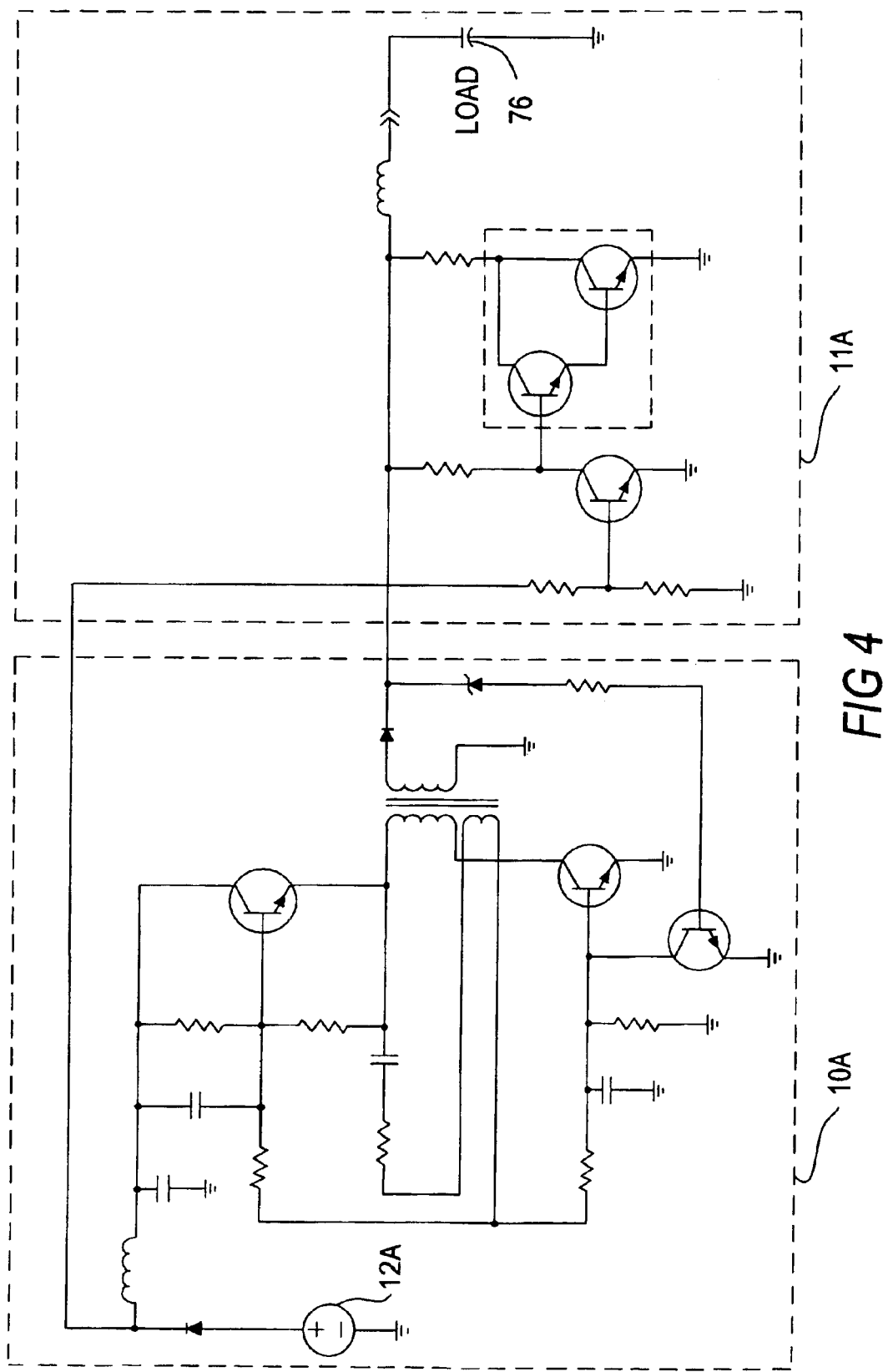
FIG. 4 is an electronic schematic of an apparatus for driving a smart material actuator implementing the controllable power source of FIG. 1 and the switching circuitry of FIG. 2.

Referring now to FIG. 4, a preferred embodiment of a driver for a smart material actuator capacitive load 76 according to the present invention includes a controllable power source 10A and switching circuitry 11A. A switchable input voltage source 12A is applied to the controllable power source 10A and at the same time the switching circuitry 11A is disabled and the capacitive load 76 is charged. When the input voltage source 12A is removed, the controllable power source 10A is stopped, and the switching circuitry 11A is enabled and the capacitive load 76 is discharged. The actual impedance of the controllable power source 10A controls the rate at which the capacitive load 76 is charged, and the impedance of the switching circuitry 11A controls the rate which the capacitive load 76 is discharged.

Figure 5:
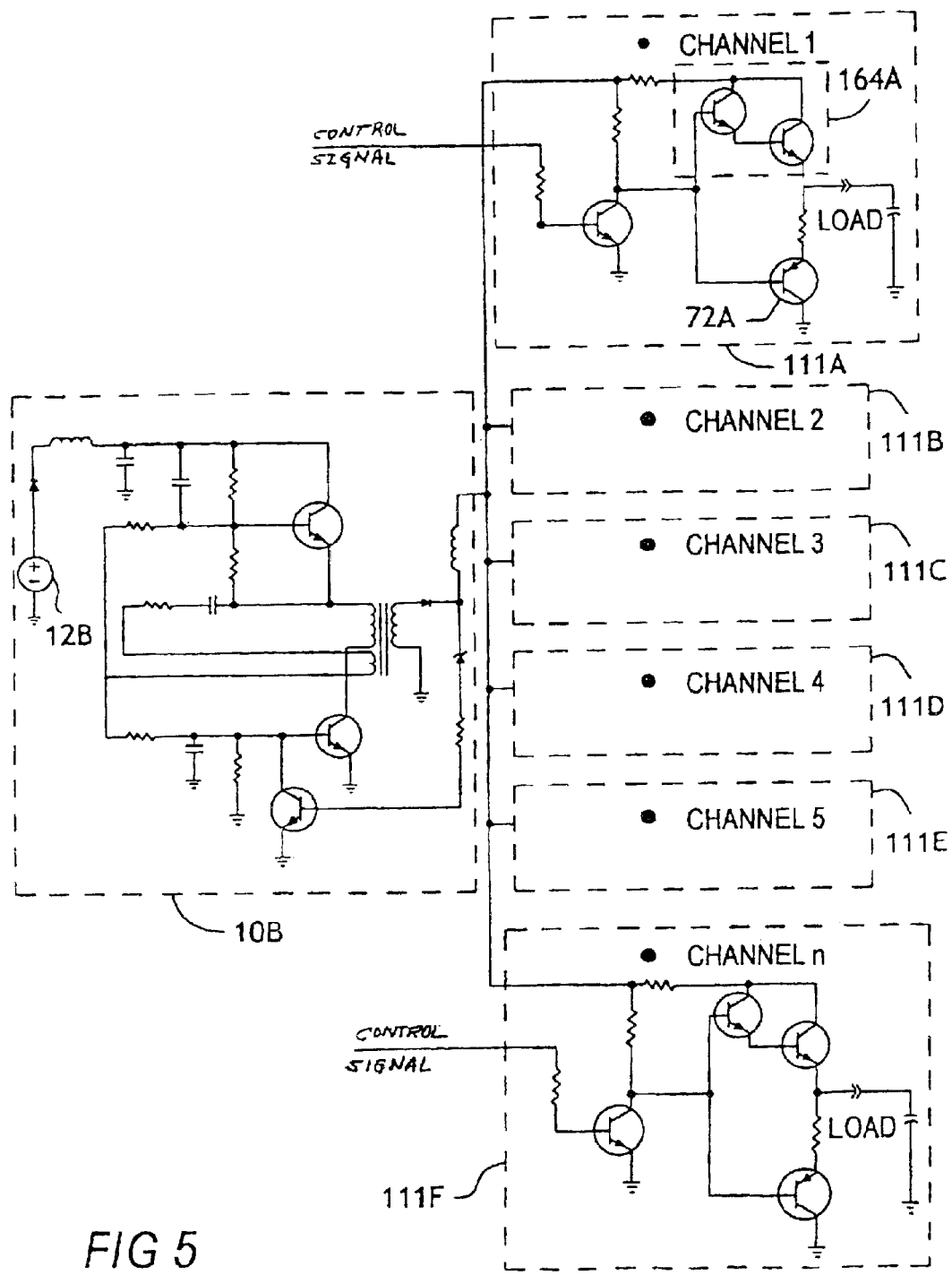
FIG. 5 is an electronic schematic of an apparatus for driving a smart material actuator implementing the switching circuitry of FIG. 3 and the DC to DC converter of FIG. 1.

Referring now to FIG. 5, a second embodiment of a driver for a smart material actuator according to the present invention includes a controllable power source 10B and switching circuitry 111A, 111B, 111C, 111D, 111E, 111F. An input voltage source 12B is applied to the controllable power source 10B. The voltage to be switched is generated continuously. When the control signal to the switch circuits 111A, 111B, 111C, 111D, 111E, 111F is low, the NPN Darlington pair 164A of each respective circuit 111A, 111B, 111C, 111D, 111E, 111F, but shown only in circuits 111A and 111F, is enabled and each respective capacitive load is charged. When the control signal is high, the PNP transistor 72A of each respective unit 111A, 111B, 111C, 111D, 111E, 111F, but shown only in circuits 111A and 111F, is enabled and the capacitive load is discharged.

In the embodiment of FIGS. 1–5, various components were included according to the current carrying ability, voltage rating, and type of the components. Other suitable components can include Field Effect Transistor (FET) and bipolar junction transistor (BJT) small signal and power transistors, wire wound, thin film and carbon comp resistors, ceramic, tantalum and film capacitors, wound, and Low Temperature cofired ceramic (LTCC) transformers, or any combination of suitable components commonly used for high volume production. Although these materials given as examples provide excellent performance, depending on the requirements of an application use of other combinations of components can be appropriate. Likewise, the embodiment illustrates components that are commercially available.

While the invention has been described in conjunction with what is presently considered to be the most practical and preferred embodiment, it is to be understood that the invention is not to be limited to the disclosed embodiment but, on the contrary, it is intended to cover various modifications and equivalent arrangements included within the spirit and scope of the appended claims, which scope is to be accorded the broadest interpretation so as to encompass all such modifications and equivalent structures as permitted under law.

What is claimed is:

1. An apparatus comprising:
    a smart material actuator;
    a controllable power source for charging the smart material actuator; switching circuitry for discharging the smart material actuator; and
    a switch for activating an input voltage to the controllable power source, the input voltage simultaneously providing a switching control signal for preventing the switching circuitry from discharging the smart material actuator.

2. The apparatus of claim 1, wherein a rate of discharge is determined by an impedance of the switching circuitry.

3. The apparatus of claim 1, wherein a rate of charge is determined by an impedance of the controllable power source.

4. The apparatus of claim 1 wherein the switch simultaneously removes the input voltage to the controllable power source and provides a switching control signal enabling the switching circuitry to discharge the smart material actuator.

5. The apparatus of claim 1 wherein the switching circuitry comprises a transistor operable to receive the switching control signal from the input voltage, a Darlington pair coupled to the transistor and a resistor coupled to the Darlington pair and the smart material actuator, the resistor dissipating energy stored in the smart material actuator when the input voltage provides a switching control signal enabling a discharge of the smart material actuator.

6. The apparatus of claim 1, wherein the controllable power source includes a DC-to-DC converter having a transformer including primary and secondary windings and controllable drive circuitry coupled to the primary winding of the transformer for generating drive signals 180 degrees out of phase with one another.

7. The apparatus of claim 6 further comprising a rectifier associated with the secondary winding of the transformer for generating a DC voltage from an AC signal associated with the secondary winding.

8. The apparatus of claim 6 further comprising noise reduction circuitry coupled to the secondary winding of the transformer for filtering noise generated by the controllable drive circuitry.

9. The apparatus of claim 8, wherein the noise reduction circuitry includes a bead inductor and a bypass capacitor.

10. The apparatus of claim 6, wherein the DC-to-DC converter further comprises means for reverse polarity protection associated with an input to the DC-to-DC converter.

11. The apparatus of claim 10, wherein the reverse polarity protection means is a diode.

12. The apparatus of claim 6, wherein the transformer is of wound core design.

13. The apparatus of claim 6, wherein the transformer is of LTCC design.

14. The apparatus of claim 6, wherein the controllable drive circuitry is self-oscillating.

15. The apparatus of claim 14 further comprising means for enabling the self-oscillating driver.

16. The apparatus of claim 15, wherein the enabling means includes voltage feedback means for feeding back voltage.

17. The apparatus of claim 16, wherein the voltage feedback means includes a Zener diode.

18. An apparatus comprising:
a smart material actuator, and
at least one of a controllable power source for charging the smart material actuator and a switching circuitry for discharging the smart material actuator; wherein the controllable power source includes a DC-to-DC converter having a transformer including primary and secondary windings and controllable drive circuitry coupled to the primary winding of the transformer for generating drive signals 180 degrees out of phase with one another; wherein the controllable drive circuitry is self-oscillating; and wherein the self-oscillating drive circuitry further comprises feedback means for delivering a feedback signal, the feedback means including push-pull circuitry and an auxiliary winding associated with the transformer.

19. The apparatus of claim 18, wherein the push-pull circuitry includes a pair of NPN transistors.

20. The apparatus of claim 18 further comprising means for biasing the push-pull circuitry.

21. The apparatus of claim 20, wherein the biasing means includes a voltage divider.

22. An apparatus for driving a smart material actuator comprising:
a controllable power source connectible to the smart material actuator for charging the smart material actuator; and
a switching circuitry coupled between the controllable power source and the smart actuator for discharging the smart material actuator in response to removal of an input voltage to the controllable power source.

23. The apparatus of claim 22, wherein the switching circuitry is responsive to a single controlled input signal.

24. The apparatus of claim 22, wherein the switching circuitry is responsive to one of a plurality of controlled input signals.

25. A method for driving a smart material actuator comprising the steps of:
charging the smart material actuator with a controllable power source connectible to the smart material actuator; and
discharging the smart material actuator in response to removal of an input voltage to the controllable power source with a switching circuitry coupled between the controllable power source and the smart actuator.

26. The method of claim 25 further comprising the step of generating drive signals 180 degrees out of phase with one another where the controllable power source includes a DC to DC converter having a transformer including primary and secondary windings and controllable drive circuitry coupled to the primary winding of the transformer.

27. The method of claim 26 wherein the controllable drive circuitry is self-oscillating.

28. The method of claim 27 further comprising the step of delivering a feedback signal derived from push-pull circuitry and an auxiliary winding associated with the transformer.

29. The method of claim 25 further including the step of generating a DC voltage from an AC signal associated with the secondary winding of the transformer by using a rectifier associated with the secondary winding.

30. The method of claim 25 further including the step of reducing noise generated by the controllable drive circuitry by coupling noise reduction circuitry to the secondary winding of the transformer.

31. The method of claim 25, further including the step of determining the rate of discharge by an impedance of the switching circuitry.

32. The method of claim 25, further including the step of determining the rate of charge by an impedance of the controllable power source.

33. An apparatus comprising:
a smart material actuator;
means for charging the smart material actuator, the charging means connectible to an input voltage;
means for discharging the smart material actuator connectible to the input voltage; and
means for simultaneously disabling the input voltage to the charging means and enabling the discharging means to discharge the smart material actuator.

34. The apparatus of claim 33 wherein the charging means comprises a controllable power source including a DC-to-DC converter driven by self-oscillating push-pull circuitry.

35. The apparatus of claim 34 wherein the DC-to-DC converter includes a transformer and the self-oscillating push-pull circuitry includes feedback from an auxiliary winding of the transformer.

36. The apparatus of claim 33 wherein the discharging means comprises a transistor operable to receive a switching control signal from the input voltage, a Darlington pair coupled to the transistor and a resistor coupled to the Darlington pair and the smart material actuator, the resistor dissipating energy stored in the smart material actuator when the discharging means is enabled.

37. The apparatus of claim 33 wherein the means for simultaneously disabling the input voltage and enabling the discharging means is operable to simultaneously enable the input voltage and disable the discharging means.

* * * * *